United States Patent
Wilson et al.

(10) Patent No.: US 9,325,284 B2
(45) Date of Patent: Apr. 26, 2016

(54) RADIO FREQUENCY COMPOSITE CLASS-S POWER AMPLIFIER HAVING DISCRETE POWER CONTROL

(71) Applicant: LSI Corporation, San Jose, CA (US)

(72) Inventors: Ross S. Wilson, Menlo Park, CA (US);
Said E. Abdelli, Minneapolis, MN (US);
Peter Kiss, Basking Ridge, NJ (US);
Donald R. Laturell, Oak Hill, FL (US);
James F. MacDonald, Mendota Heights, MN (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 99 days.

(21) Appl. No.: 14/380,915

(22) PCT Filed: Feb. 2, 2013

(86) PCT No.: PCT/US2013/024536
§ 371 (c)(1),
(2) Date: Aug. 25, 2014

(87) PCT Pub. No.: WO2014/120246
PCT Pub. Date: Aug. 7, 2014

(65) Prior Publication Data
US 2015/0015329 A1    Jan. 15, 2015

(51) Int. Cl.
*H03F 3/217* (2006.01)
*H03F 1/02* (2006.01)
(Continued)

(52) U.S. Cl.
CPC ............ *H03F 3/2171* (2013.01); *H03F 1/0222* (2013.01); *H03F 1/0277* (2013.01); *H03F 1/3241* (2013.01); *H03F 1/56* (2013.01); *H03F 3/193* (2013.01); *H03F 3/195* (2013.01); *H03F 3/211* (2013.01); *H03F 3/2175* (2013.01); *H03F 3/245* (2013.01); *H03F 3/45179* (2013.01);
(Continued)

(58) Field of Classification Search
CPC ........... H03F 3/217; H03F 1/02; H03F 3/193; H03F 3/19; H03F 1/0277; H03F 1/56; H03F 3/195; H03F 3/211; H03F 3/245; H03F 3/45179; H03F 3/72
USPC ..................... 330/10, 124 R, 207 A, 251, 295
See application file for complete search history.

(56) References Cited

U.S. PATENT DOCUMENTS 5,861,777 A * 1/1999 Sigmon ................. H03F 1/0222
                                                                    330/136
6,137,358 A    10/2000 Midya et al.
(Continued)

*Primary Examiner* — Khanh V Nguyen

(57) ABSTRACT

A composite amplifier providing digitally selectable amplification includes a plurality of channels and a combiner. Each of the channels includes a digitally controllable selector, a Class-S power amplifier, and bandpass filter. The digitally controllable selector selectively couples a digital bitstream to the amplifier. The amplifier receives the digital bitstream and provides an amplified signal. The bandpass filter generates a filtered signal as a function of the amplified signal. The combiner couples filtered signals provided by the channels to form a composite output signal. A method of providing digitally selectable amplification includes steps of: selectively coupling a digital bitstream to a plurality of channels in the amplifier; amplifying the digital bitstream to provide an amplified signal associated with a corresponding one of the channels; filtering amplified signals associated with the channels to provide corresponding filtered signals; and combining the filtered signals to generate a composite output signal.

23 Claims, 12 Drawing Sheets

(51) Int. Cl.
*H03F 1/32* (2006.01)
*H03F 1/56* (2006.01)
*H03F 3/195* (2006.01)
*H03F 3/21* (2006.01)
*H03F 3/24* (2006.01)
*H03F 3/45* (2006.01)
*H03F 3/72* (2006.01)
*H03F 3/193* (2006.01)

(52) U.S. Cl.
CPC  *H03F 3/72* (2013.01); *H03F 3/217* (2013.01); *H03F 2200/336* (2013.01); *H03F 2200/387* (2013.01); *H03F 2200/408* (2013.01); *H03F 2200/411* (2013.01); *H03F 2200/451* (2013.01); *H03F 2200/504* (2013.01); *H03F 2201/3212* (2013.01); *H03F 2201/3233* (2013.01); *H03F 2203/45638* (2013.01); *H03F 2203/45731* (2013.01); *H03F 2203/7215* (2013.01); *H03F 2203/7236* (2013.01)

(56) References Cited

U.S. PATENT DOCUMENTS

| | | | |
|---|---|---|---|
| 7,091,774 B1 * | 8/2006 | Smiley | H03F 3/217 330/124 R |
| 7,184,490 B1 | 2/2007 | Rybicki | |
| 7,701,286 B2 * | 4/2010 | Gupta | H03F 3/2178 330/127 |
| 2010/0227599 A1 | 9/2010 | Vella-Coleiro et al. | |
| 2010/0244949 A1 | 9/2010 | Gustavsson et al. | |
| 2010/0266066 A1 * | 10/2010 | Takahashi | H03F 1/0222 375/295 |
| 2011/0019728 A1 * | 1/2011 | Khoury | H03K 7/08 375/238 |

* cited by examiner

INPUT BITSTREAM SPECTRUM:MAGNIFIED

PICOCELL DRIVER INPUT RF POWER

| RLoad | Pin_dBm W | Pin_W |
|---|---|---|
| 0.100 | -3.471 | 4.497E-4 |

PICOCELL DRIVER OUTPUT RF POWER

| RLoad | ...deliveredTo_RLoad_W |
|---|---|
| 0.100 | 0.007 |
| 0.200 | 0.013 |
| 0.300 | 0.017 |
| 0.400 | 0.020 |
| 0.500 | 0.021 |
| 0.600 | 0.021 |
| 0.700 | 0.020 |
| 0.800 | 0.020 |
| 0.900 | 0.019 |
| 1.000 | 0.018 |
| 1.500 | 0.015 |
| 2.000 | 0.012 |
| 2.500 | 0.010 |
| 3.000 | 0.009 |
| 3.500 | 0.008 |
| 4.000 | 0.007 |
| 4.500 | 0.006 |
| 5.000 | 0.006 |

RF OUT TIME DOMAIN

INPUT BITSTREAM SPECTRUM

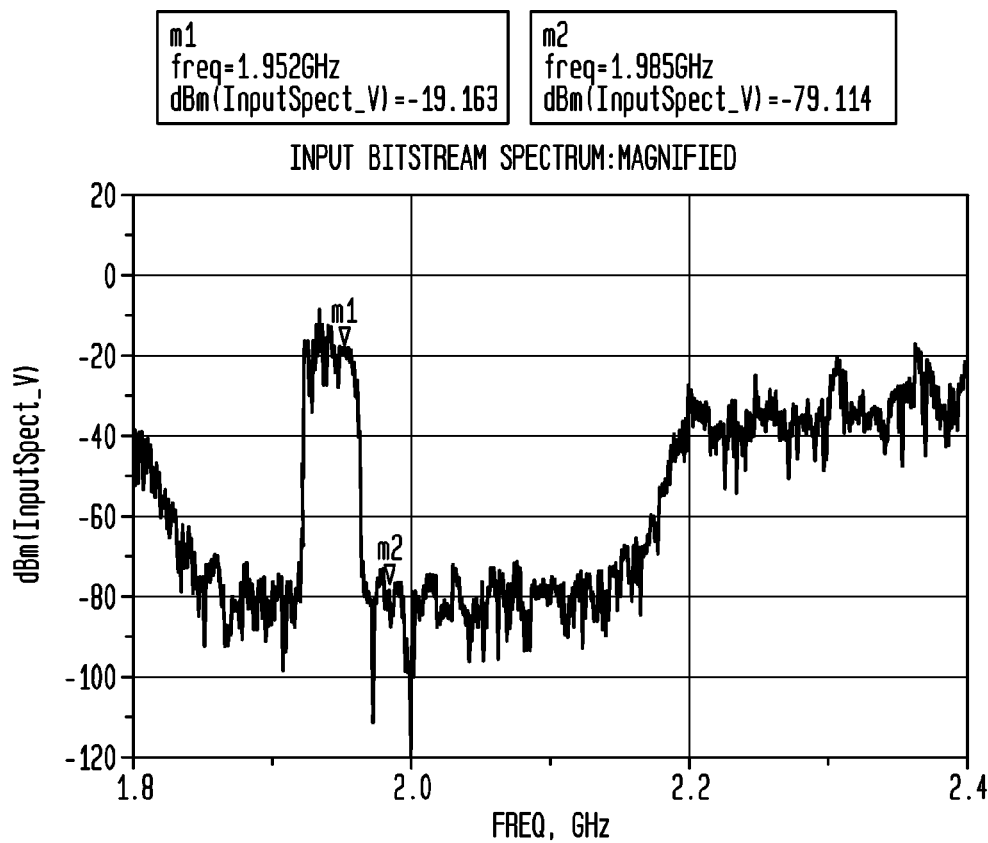

RADIO FREQUENCY COMPOSITE CLASS-S POWER AMPLIFIER HAVING DISCRETE POWER CONTROL

CROSS-REFERENCE TO RELATED APPLICATION(S)

The present application is a national stage entry, under 35 U.S.C. §371, of PCT International Patent Application No. PCT/US2013/024536 filed on Feb. 2, 2013, the complete disclosure of which is expressly incorporated herein by reference in its entirety for all purposes.

BACKGROUND

Class-S radio frequency (RF) power amplifiers use single-bit sequences to synthesize radio frequency signals. As Class-S technology moves the digital-to-analog boundary towards the power amplifier output stage, an increase in integration relative to analog RF signal processing techniques is made possible. Class-S power amplifiers refer to those amplifiers that filter an applied bitstream, which encodes a desired modulated RF signal, to deliver the bitstream in high-power analog form.

Bitstream generators used in Class-S based RF transmitters upshift baseband information to a desired carrier frequency while shaping single-bit quantization noise power away from a carrier frequency, $F_{CARRIER}$. In Class-S power amplifiers associated with the popular 2.14 gigahertz (GHz) cellular band, the output stage of the amplifier is switched at a rate in excess of eight (8) billion transitions per second. High-power gallium nitride (GaN) RF transistors have difficulty toggling at this rate, and thus an alternative capable of exploiting transistors having sufficiently fast switching speed would be highly advantageous.

SUMMARY

Embodiments of the invention disclosed herein advantageously extend a Class-S power amplifier configuration to a parallel-path scheme, which enables the use of multiple small-geometry fast-switching devices to overcome disadvantages of conventional single-path power amplifier configurations. Small-geometry fast-switching devices are generally faster and consume substantially less power and area when compared with larger devices commonly used in single-path techniques. As a consequence of the parallel-path scheme, direct output power control is made feasible, which permits a straightforward reduction in power consumption when full output power associated with all of the paths operating concurrently is not required. In this manner, embodiments of the invention support digitally programmable output power while enabling realization of power amplification using a plurality of small-geometry components in a cost-effective manner.

In accordance with an embodiment of the invention, a composite amplifier that provides digitally-selectable amplification includes a plurality of channels and a combiner. Each of the plurality of channels includes a digitally-controllable selector, a Class-S power amplifier, and a bandpass filter. The digitally-controllable selector selectively couples a digital bitstream to the Class-S power amplifier. The Class-S power amplifier amplifies the digital bitstream, thereby providing an amplified signal. The bandpass filter filters the amplified signal, thereby providing a filtered signal. The combiner operatively couples filtered signals associated with the plurality of channels to form a composite output signal. A corresponding integrated circuit and system are also disclosed.

In accordance with another embodiment of the invention, a method of providing digitally-selectable amplification includes: selectively coupling, using a digitally-controllable selector, a digital bitstream to a plurality of channels; amplifying, using a Class-S power amplifier, the digital bitstream in the plurality of channels to provide amplified signals; filtering, using a bandpass filter, the amplified signals in the plurality of channels to provide filtered signals; and combining, using a combiner, the filtered signals to form a composite output signal.

Embodiments of the invention disclosed herein will become apparent from the following detailed description, which is to be read in connection with the accompanying drawings.

BRIEF DESCRIPTION OF THE DRAWINGS

The following drawings are presented by way of example only and without limitation, wherein like reference numerals indicate corresponding elements throughout the several views, and wherein:

FIGS. 7A-7F show exemplary simulated performance data associated with the illustrative embodiment shown in FIG. 6.

Figure 1:
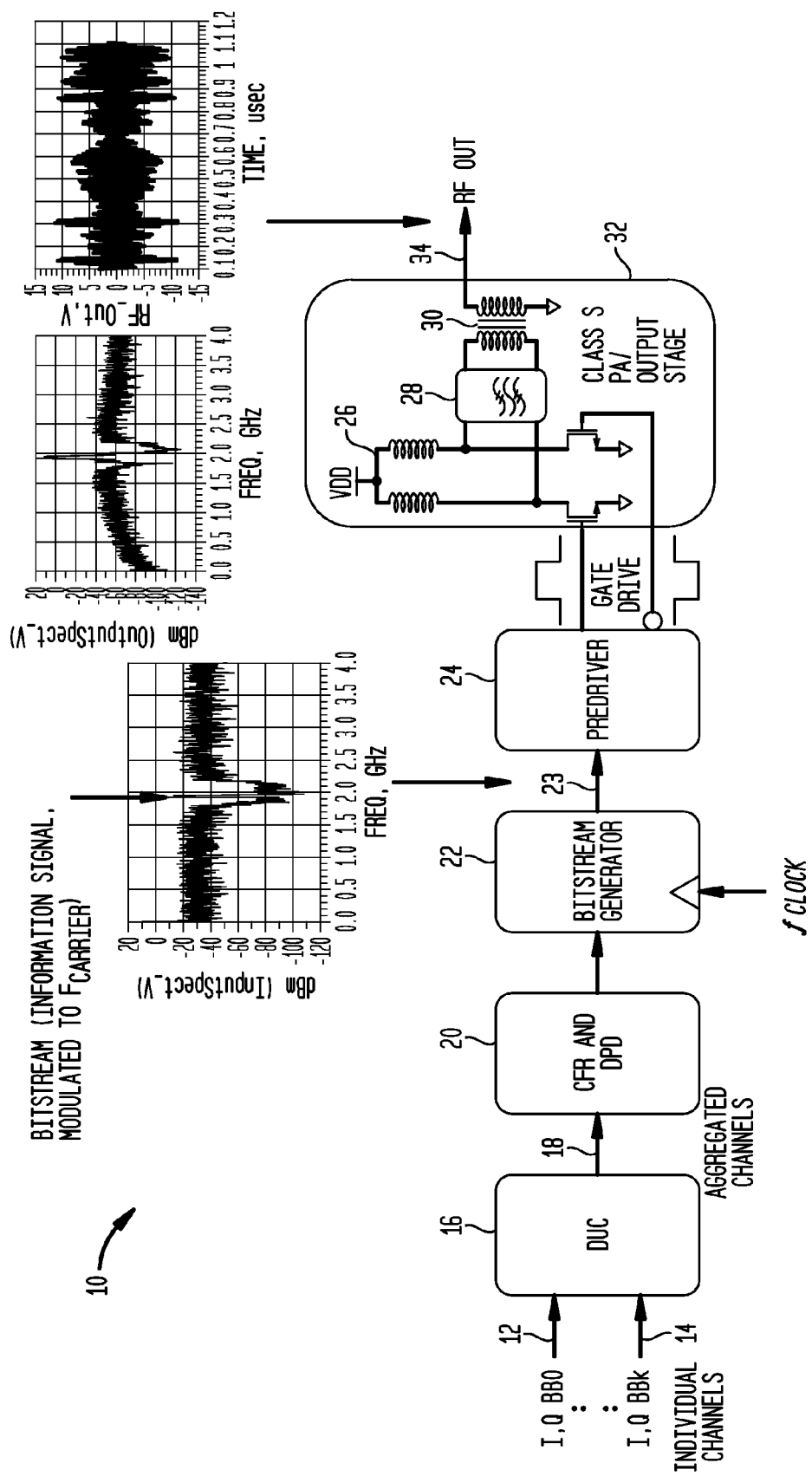
FIG. 1 is a block diagram depicting at least a portion of an exemplary Class-S power amplifier transmit chain.

It is to be appreciated that elements in the figures are illustrated for simplicity and clarity. Common but well-understood elements, which may be useful or necessary in a commercially feasible embodiment, are not necessarily shown in order to facilitate a less hindered view of the illustrated embodiments.

DETAILED DESCRIPTION

Embodiments of the invention will be described herein in the context of illustrative composite power amplifiers having a parallel-path scheme which enables the use of multiple small-geometry fast-switching devices to overcome disadvantages of conventional single-path power amplifier configurations. It should be understood, however, that embodiments of the invention are not limited to these or any other particular power amplifier circuits. Rather, embodiments of the invention are more broadly related to techniques for forming an amplifier having a digitally selectable amplification (i.e., gain). Moreover, it will become apparent to those skilled in the art given the teachings herein that numerous modifications can be made to the illustrative embodiments shown that are within the scope of the claimed invention. That is, no limitations with respect to the embodiments shown and described herein are intended or should be inferred.

As a preliminary matter, for purposes of clarifying and describing embodiments of the invention, the following table provides a summary of certain acronyms and their corresponding definitions, as the terms are used herein:

Table of Acronym Definitions

| Acronym | Definition |
|---|---|
| RF | Radio frequency |
| CMOS | Complementary metal-oxide semiconductor |
| MOS | Metal-oxide semiconductor |
| DAC | Digital-to-analog converter |
| ZOH | Zero-order hold |
| DPD | Digital predistortion |
| CFR | Crest factor reduction |
| LC | Inductive-capacitive |
| FET | Field-effect transistor |
| BiCMOS | Bipolar complementary metal-oxide semiconductor |
| MMIC | Monolithic microwave integrated circuit |
| DUC | Digital up-convertor |
| IF | Intermediate frequency |
| LTE | Long-term evolution |
| SQNR | Signal-to-quantization noise ratio |
| SNDR | Signal-to-noise and distortion ratio |

Class-S RF power amplifiers use single-bit sequences to synthesize RF signals. As Class-S technology moves the digital-to-analog boundary towards the power amplifier output stage, an increase in integration relative to analog RF signal processing techniques is made possible.

Bitstream generators for use in Class-S RF transmitters upshift baseband information to a desired carrier frequency while shaping single-bit quantization noise power away from a carrier frequency, $F_{CARRIER}$. To minimize zero-order hold losses in an output stage, which is essentially a single-bit power digital-to-analog converter (DAC), and to provide sufficient oversampling to support noise shaping, a clock frequency used by the bitstream generator is set to a value defined by the following equation:

$$f_{CLOCK} = 4 \cdot F_{CARRIER} \quad (1)$$

Zero-order hold (ZOH) refers to a mathematical model of a practical signal reconstruction performed by the DAC. That is, it describes the effect of converting a discrete-time signal to a continuous-time signal by holding each sample value constant for one sample interval. Thus, ZOH loss is the loss in accuracy due to conversion of the continuous-time signal to the discrete-time signal, and is acceptably small at approximately 0.9 dB for an oversampling factor of four used in equation (1) above.

In Class-S amplifiers associated with an illustrative 2.14 GHz cellular band, the output stage of the power amplifier is switched at a rate in excess of eight (8) billion transmissions per second. However, high-power gallium nitride (GaN) radio frequency transistors have difficulty toggling at this rate, and thus an alternative approach is highly advantageous. The 2.14 GHz frequency band is presented by way of example only, to illustrate the switching speed burdens placed on the power amplifier in certain applications. However, it is to be appreciated that embodiments of the invention are not limited to any specific frequency or frequency band of operation.

Embodiments of the invention disclosed herein are directed to a Class-S amplifier output stage configuration in which small-geometry, fast-switching devices, such as, for example, monolithic integrated CMOS transistors, are used in combination to achieve greater power output than that provided by isolated power amplifier output stages, such as in the configuration shown in FIG. 1. The Class-S amplifier output stage according to an embodiment of the invention also provides direct digital control of output power using a power control digital bus.

In the Class-S amplifier, the input baseband signal is transformed to a binary pulse sequence or bitstream by a modulator or bitstream generator, which is implementable as a sigma-delta modulator, although embodiments of the invention are not limited to any specific implementation of the bitstream generator. The bitstream generator shapes single-bit quantization noise power, which positions noise power away from a signal of interest. The bitstream or pulse sequence is amplified by a switching amplifier output stage. A bandpass filter at the output of the switching amplifier is used to suppress outband-shaped noise, and pass the signal of interest and any residual noise within the band containing the signal of interest. An increase in efficiency relative to non-switching configurations, such as, for example, Class-B configurations, is derived from the use of a pulse modulation scheme and operation of the Class-S output stage in a pure switching mode.

The voltage-mode configuration is an embodiment of a Class-S power output stage. In the voltage-mode amplifier configuration, the switching stage produces a voltage output. An alternative Class-S amplifier configuration is referred to herein as a current-mode configuration and includes an output stage that generates a current output. The terms "Class-D" and "voltage-mode Class-S" are often used interchangeably. FIG. 1 shows the topology of a voltage-mode Class-S amplifier configuration in which a series resonant filter is used. In a current-mode Class-S amplifier configuration, a shunt resonant filter is used.

The term "Class-S," when used in an RF context, refers broadly to the use of sigma-delta-like modulation, or alternative switching means, to generate the bitstream. More recent audio frequency implementations also use sigma-delta-like modulation to generate the bitstream, but the term "Class-S" is not generally used in an audio frequency context. The embodiments disclosed herein, however, may also be used in audio applications. Audio frequency digital power amplifiers switch at speeds approximately three orders of magnitude slower than RF power amplifiers. Digital predistortion (DPD) and crest factor reduction (CFR) functions of Class-S RF power amplifiers are generally not used in audio applications. A series inductive-capacitive (LC) network used in voltage-mode Class-S amplifiers creates a bandpass filter, which passes signals in a band of interest centered about a desired signal, while rejecting noise, or other signal components, pushed outside the frequency band of interest by the modulation process.

Figure 2:
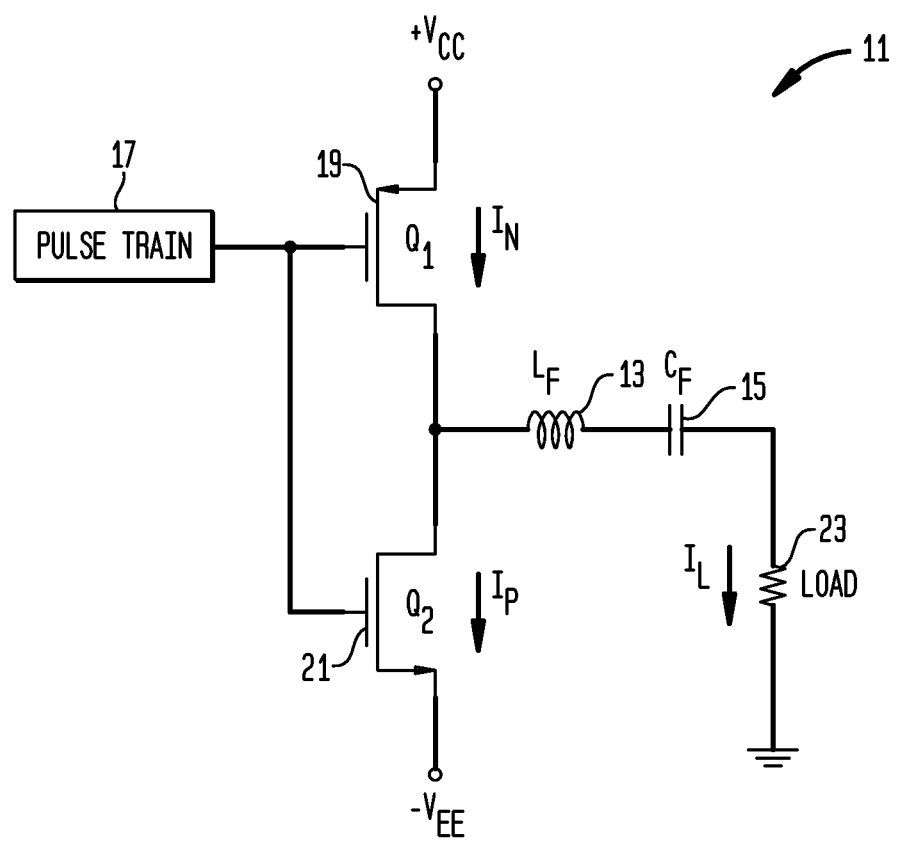
FIG. 2 is a schematic diagram depicting at least a portion of an exemplary Class-S voltage-mode power output stage.

FIG. 2 is a schematic diagram depicting at least a portion of an output stage 11 of an exemplary Class-S voltage-mode power amplifier, which is suitable for use in conjunction with embodiments of the invention disclosed herein. The output stage 11 includes a voltage-switching stage, followed by a bandpass filter stage. The bandpass filter stage is implemented, in this embodiment, using an LC filter which includes an inductor 13 coupled in series with a capacitor 15. More complex filters can be employed to achieve additional out-of-band quantization noise rejection, in which case the lumped-element realization shown in FIG. 2 would be replaced with transmission line or cavity-based distributed elements, as will become apparent to those skilled in the art. A pulse train 17 is applied to gate terminals of complementary (i.e., P-type and N-type) field-effect transistors (FETs), 19 and 21, drain terminals of which are coupled together. A source terminal of P-type transistor 19 is coupled to a first voltage supply, which is $V_{CC}$ in this embodiment, and a source of N-type transistor 21 is coupled to a second voltage supply, which is $V_{EE}$ in this embodiment. The inductor ($L_F$) 13, capacitor ($C_F$) 15, and a load resistor (Load) 23 are coupled together in series between the drain terminals of transistors 19, 21 and ground.

It is to be appreciated that, because a metal-oxide semiconductor (MOS) device is symmetrical in nature, and thus bi-directional, the assignment of source and drain designations in the MOS device is essentially arbitrary. Therefore, the source and drain of a given MOS device may be referred to herein generally as first and second source/drain, respectively, where "source/drain" in this context denotes a source or a drain.

Although the above description is directed to an embodiment utilizing complementary device types, it is equally possible to utilize only N-type FET devices or only P-type FET devices. For example, in an all N-type transistor output stage, transistor Q1 is of N-type, with its source and drain terminals coupled, respectively, to the drain terminal of N-type transistor Q2 (i.e., the node coupled with inductor 13) and $V_{CC}$.

The gate terminal of transistor Q1 is driven by a level-shifted pulse train 17 configured to turn off transistor Q1 when transistor Q1 is on, and likewise to turn on transistor Q1 when transistor Q1 is off. Transistor Q1 is turned off by forcing the gate terminal of transistor Q1 to a voltage $V_S$, wherein $V_S$ is a potential at the drain terminal of transistor Q2 and the source terminal of transistor Q1. Conversely, transistor Q1 is turned on by forcing the gate terminal of transistor Q1 to a voltage $V_S$ plus $V_{ON}$, wherein $V_{ON}$ is equal to a potential (e.g., transistor threshold voltage) required to turn on transistor Q1.

With reference now to FIG. 1, a block diagram depicts at least a portion of an exemplary Class-S power amplifier transmit chain 10. The power amplifier transmit chain 10 in this embodiment is a single-path Class-S based power amplifier transmit chain. A plurality of complex baseband signals 12, 14 are received by a digital up-convertor (DUC) 16, which aggregates the plurality of complex baseband signals 12, 14 into a composite signal 18. Aggregation is achieved by multiplying each of the 0 to k indexed complex baseband signals $(I_k+jQ_k)$ by a complex exponential $e^{j2\pi f_k t}$, where k is an integer and $f_k - f_{k-1}$ represents channel bandwidth. The results of the multiplications are summed to produce a composite signal at an appropriate intermediate frequency (IF). The composite signal 18 is then applied to a CFR and DPD block 20 prior to application to a bitstream generator 22.

The CFR function reduces signal dynamic range. For example, whereas a typical long-term evolution (LTE) signal may exhibit a peak-to-average power ratio of approximately 15 decibels (dB), after CFR, this value may be reduced with acceptable distortion to approximately 8 dB using threshold-cross detection and pulse-addition. The purpose of DPD is to pre-distort the input signal to the power amplifier in order to counteract nonlinearities in the power output stage. DPD is customarily performed by demodulating the power amplifier output using a high-quality receiver, comparing the result with a desired transmit signal, and adaptively forming a pre-distortion/preshaping lookup table approximately inverse to the power amplifier nonlinearity. The DPD correction is incorporable into the bitstream generator.

Sigma-delta bitstream generators are implementable in various ways, as will be known by those skilled in the art. For example, one classical method closes a feedback loop around a single-bit quantizer (a signum operator). The feedback loop includes filters that shape the resulting quantization noise to achieve attenuation within the signal band of interest centered at the carrier frequency. Another approach relies on Viterbi decoding techniques to find an optimal-in-least-squares-sense bitstream having desired quantization noise spectral properties. Aggregation enables a single transmit chain to serve multiple baseband channels and is an intrinsic part of wireless standards, such as LTE.

The bitstream generator 22 shown in FIG. 1, implementation choices of which include, for example, a bandpass sigma-delta convertor, a Viterbi-based optimal-pulse-sequence unit, or a pulse width modulator, upshifts the signal received from the CFR DPD 20 to a desired carrier frequency, $F_{CARRIER}$, while shaping single-bit quantization noise power away from the carrier frequency $F_{CARRIER}$. The noise is shaped away from the carrier frequency so that a bandpass filter passing the carrier and its associated signal band can exclude the noise. Under N bits of quantization (in this case, N bits is equal to 1 and the signal is assumed to be uniformly distributed), the signal-to-quantization noise ratio (SQNR) is provide by SQNR=6.02×N dB. Accordingly, a primary role of the bitstream generator 22 is to perform single-bit quantization, while shaping the noise spectrum to move noise power outside the signal band of interest.

The bitstream generator 22 is adapted to receive a system clock, $f_{CLOCK}$, and is operative to generate a modulated bitstream 23 output to a predriver. The predriver 24 receives the low-level digital bitstream 23 from the bitstream generator 22, and buffers and amplifies the digital bitstream 23 to a level sufficient to drive the gates of output transistors in an output stage 32 of the power amplifier transmit chain 10. Low impedance drive is used to increase device switching speed in the presence of gate capacitance. The predriver 24 drives the switching-type power amplifier output stage 32 operating in a current-mode configuration. The output of a Class-S power amplifier 26 in the output stage 32 is applied to a bandpass filter 28 to recover the modulated RF signal and to eliminate out-of-band quantization noise. A transformer or balun 30 included in the output stage 32 converts differential output voltage provided by the bandpass filter 28 into a single-ended format RF output signal 34 for application to an antenna or transmit/receive duplexer. As indicated above, the output stage 32 is shown in current-mode configuration.

To minimize ZOH losses and provide sufficient oversampling, the system clock frequency $f_{CLOCK}$ is set as discussed above in accordance with equation (1); namely, $f_{CLOCK}=4\times F_{CARRIER}$. The power amplifier output stage 32 is switched at a rate in excess of eight billion transmissions per second in 2.14 GHz cellular band applications. However, high-power GaN RF transistors have difficulty switching at this rate. Thus, embodiments of the invention described herein with Class-S output stage configurations, which have an ability to use small-geometry fast-switching devices in combination to achieve greater power output than that provided by a single stage using larger and/or slower transistors, are highly advantageous. A further benefit realized by these embodiments is direct digital control of the output power. Output power modulation enables a significant reduction in consumed power for applications in which full output power capability is unnecessary.

Figure 3A:
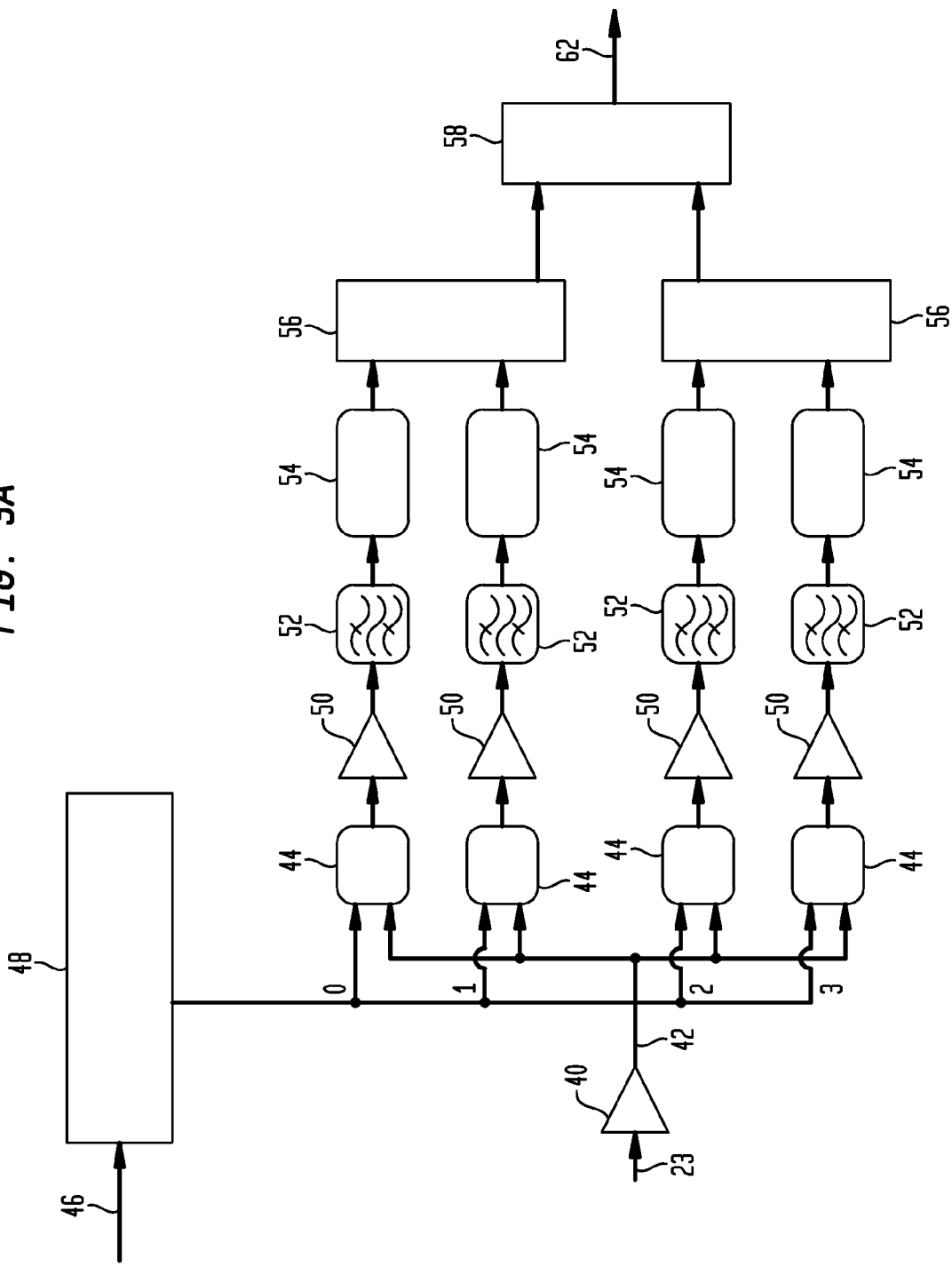
FIGS. 3A and 3B are block diagrams depicting at least portions of exemplary composite power amplifiers in which an initial driver receives a bitstream and distributes the bitstream in parallel to N independent Class-S based channels, according to embodiments of the invention.
Figure 3B:
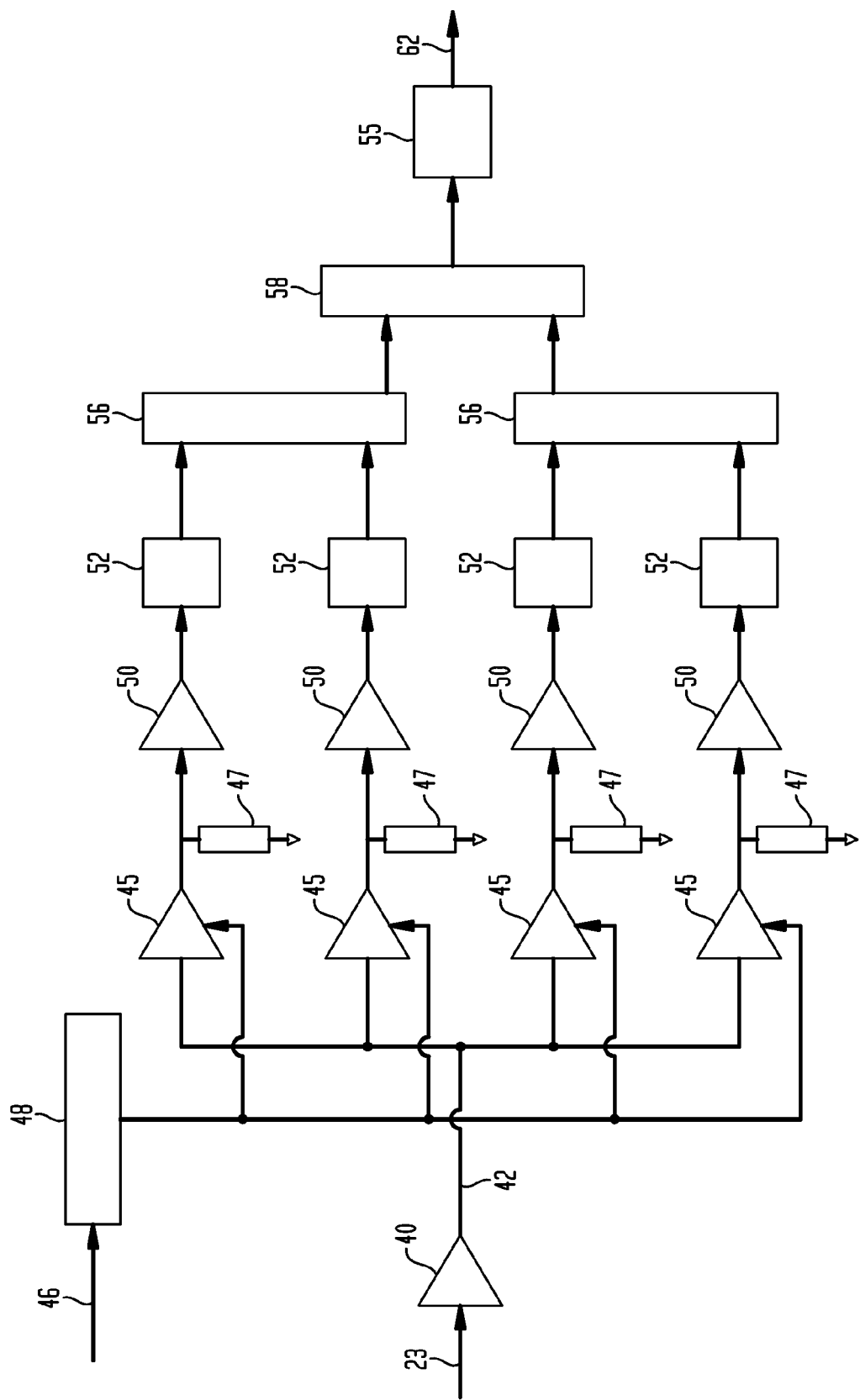

Embodiments of the invention disclosed herein extend the concept of Class-S power amplifiers to a parallel-path configuration, examples of which are shown in FIGS. 3A and 3B, that enables the use of multiple small-geometry, fast-switching devices to overcome deficiencies of the single-path configuration shown in FIG. 1. Output power modulation utilizing direct digital control of the channels is implemented in these embodiments to enable a reduction in power consumption at those times when full output power capability is not required. These embodiments are realizable using CMOS, bipolar CMOS (BiCMOS), fast-switching discrete, and/or monolithic microwave integrated circuit (MMIC) devices, among other devices. The switching speed, or the time spent in a region between the full-on and full-off states of the transistor is to be minimized. A value of $1/(4\ f_{CLOCK})$ is a satisfactory value for the switching speed.

FIGS. 3A and 3B are block diagrams depicting at least portions of exemplary composite power amplifiers in which an initial driver receives a bitstream and distributes the bitstream in parallel to N independent Class-S based channels, according to embodiments of the invention. Specifically, FIG. 3A shows an embodiment of a composite amplifier in which a driver 40 receives the bitstream 23 generated by a bitstream generator, such as, for example, the bitstream generator 22 shown in FIG. 1, and distributes a modulated digital bitstream 42 in parallel to N independent Class-S based channels, where N is an integer (e.g., N=4 in this embodiment). Each channel includes a digitally controllable selector, such as, for example, a two-input AND gate 44 in this embodiment. The AND gate 44 functions, when disabled by application of a logic zero voltage level from a binary-to-thermometer-code decoder logic block 48, or an alternative controller, to inhibit the associated channel. Amplifier output power is controlled by selectively enabling the AND gates 44 using a digital power control bus 46 applied to the binary-to-thermometer-code decoder logic 48.

Thermometer code, which is often referred to as unary, represents an n-bit binary number N using $(2^n-1)$ bits, in which there are N 1's in the least significant bit positions and 0's in each of the remaining most significant bit positions. Thus, the three-bit binary number 011 (decimal 3) has the thermometer-code equivalent of 0000111 or 0111, which when applied to the embodiment shown in FIGS. 3A and 3B, will enable three of the four channels.

Each channel also includes a power output amplifier stage 50, a bandpass filter 52, and an up-matching circuit 54, which matches the output impedance of the bandpass filter 52 to 50 ohms ($\Omega$). The N channel outputs are merged by combiners 56 and 58 that are implemented using, for example, reversed Wilkinson in-phase splitters. Alternative means for combining the N channels into M channels, where M is an integer less than N, are similarly contemplated, as will become apparent to those skilled in the art given the teachings herein.

In FIG. 3A, the ultimate output of combiners 56, 58 is a composite power amplifier output signal $P_{out}$ 62. The bandpass filters 52 are followed by the up-matching circuits 54, which are implemented, for example, using discrete sections or tapered transmission lines. The up-matching circuits 54 transform the output impedance of the bandpass filters 52 to a level suitable for application to the first tier of combiners 56, which is typically 50 $\Omega$.

Each of the channels are implementable using a voltage-mode configuration in the power output amplifier stages 50 or a current-mode configuration as shown in output stage 2 of FIG. 1. Alternatively, the power output amplifier stages 50 are fabricated using technologies, such as GaN, and are implementable on a common substrate, as will be known by those skilled in the art.

More particularly, the binary-to-thermometer-code decoder logic block 48 in FIG. 3A is coupled to a first set of inputs of the respective AND gates 44 in each of the channels, and a remaining second set of inputs of the AND gates 44 are coupled to an output of the driver 40. Each of the respective outputs of the AND gates 44 is coupled to an input of a power output amplifier stage 50 in the corresponding channel, an output of which is coupled to a bandpass filter 52 in the corresponding channel. The respective outputs of each of the bandpass filters 52 is coupled to an input of the up-matching circuit 54 in the corresponding channel, the output of which is coupled to a corresponding input of a first tier of combiners 56. The outputs of the first tier of combiners 56 are coupled to an input of the combiner 58, the output of which is a composite power amplifier output signal $P_{out}$. It is to be understood that embodiments of the invention are not limited to two tiers of combiners 56, 58. For instance, in other embodiments where the number of parallel channels N is greater than four, more than two tiers of combiners 56, 58 may be required. In other embodiment where only two parallel channels are employed (i.e., N=2), only one combiner is required.

An alternative embodiment of a composite power amplifier is shown in FIG. 3B, in which the digitally controllable selector 44 is implemented using a three-state buffer 45 and a resistor 47. In this embodiment, outputs of the binary-to-thermometer-code decoder logic 48 are coupled to control inputs of each of the three-state buffers 45, the outputs of which are coupled to inputs of the power output amplifier stage 50 in a corresponding channel. By doing so, the digital bitstream 42 applied to the inputs of the three-state buffers 45 is selectively provided at the outputs of the three-state buffers 45 based on a value of the thermometer code signal applied to the control inputs of the three-state buffers 45. The resistors 47 are coupled between the outputs of the corresponding three-state buffer 45 and ground. The outputs of the three-state buffers 45 dynamically respond to changes in the applied digital bitstream during the period of time that the three-state buffers 45 are enabled, and rely on the resistors 47 to ensure that the outputs of the three-state buffers 45 are pulled low during the period of time that the three-state buffers 45 are disabled and in a high-impedance state. Alternatively, the resistors are coupled to a positive voltage to ensure a static voltage when the three-state buffers 45 are disabled.

It is also possible to vary the order of one or more of the blocks shown in FIGS. 3A and 3B, according to embodiments of the invention. For example, the combiners 56, 58 may precede, at low impedance, the up-matching circuit 55, as shown in FIG. 3B. As yet another alternative embodiment, the bandpass filters 52 and up-matching circuits 54 shown in FIG. 3A may be consolidated into a single dual-terminated filter having unequal drive and load impedances. The delays in the channels are preferably matched to avoid losses due to channel mis-phasing in the combiners 56, 58. As still another alternative embodiment, the bandpass filters 52, 54 are implemented as a series resonant circuit centered about the carrier frequency.

Figure 4:
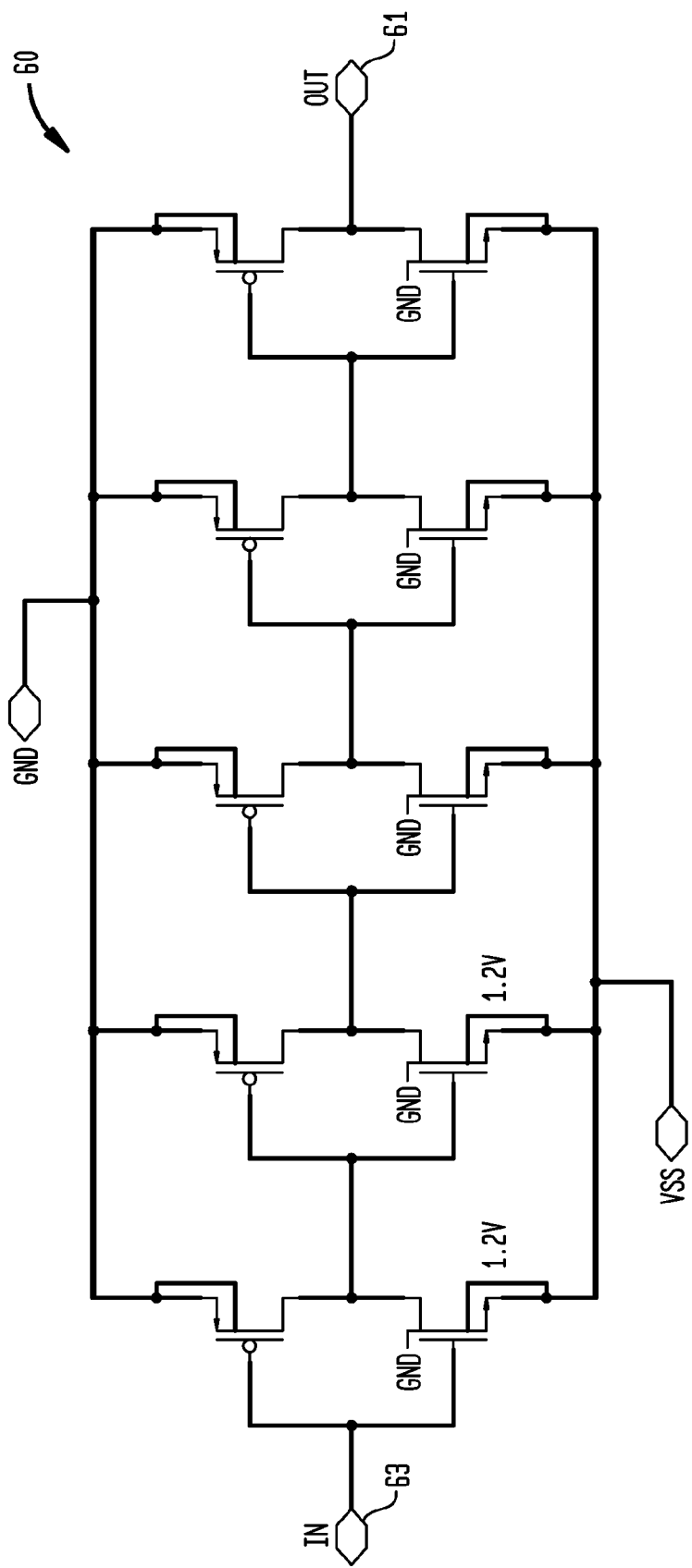
FIG. 4 is a schematic diagram depicting at least a portion of an exemplary complementary metal-oxide semiconductor (CMOS) implementation of the power amplifier shown in FIG. 3A, according to an embodiment of the invention.

FIG. 4 is a schematic diagram depicting at least a portion of an exemplary CMOS power output amplifier 60 suitable for use in implementing a given one of the channel power amplifiers 50 shown in FIG. 3A, according to an embodiment of the invention. The power output amplifier 60 includes digital telescoping inverter chains, in which strengths of the respective inverter stages are progressively increased towards an output (OUT) 61 of the amplifier. Each of the inverter stages in the amplifier 60 has a low-impedance voltage-mode output with a typical strength-increase factor of two relative to an adjacent preceding inverter stage. In one embodiment, the power amplifier 60 is fabricated using a 130-nanometer (nm) CMOS process with a voltage supply (VDD) equal to about 1.2 volts (V). A bitstream swinging between VDD and VSS (e.g., 0V or GND) is applied to an input (IN) 63 of the power amplifier 60, following which it is progressively powered-up/buffered until it reaches the output 61. At the output 61, the swing remains equal to VDD−VSS=1.2V, but is available at a very low impedance, on the order of about one ohm or less.

Alternative topologies are selectable for the channels, such as embodiments providing both voltage gain and low output impedance.

The bandpass filter impedance level required to achieve maximum power transfer from the amplification stages shown in FIG. 4 is typically significantly less than 50Ω, and thus subsequent up-matching is performed. An advantage of a low filter reference impedance is reduced sensitivity to printed circuit board etch tolerances in realizations utilizing printed or microstrip filters. Consistent with a voltage-mode drive, the input of the bandpass filter 52 is of a series resonant type in order to pass a desired signal centered at $F_{CARRIER}$ while presenting an ideally open-circuit to quantization noise and high signal harmonics outside the frequency band of interest.

A channel power output stage load impedance associated with the embodiment shown in FIG. 3A can be determined by various methods. For example, with reference again to FIG. 3A, in a load-pull simulation approach, the driver 40 is detached from its load, and a variable impedance is substituted for the load. The driver 40 input is driven with a bitstream having a signal spectrum similar to that to be passed by the power amplifier 50. The variable load impedance is programmably varied using an algorithm, or alternative means, to achieve maximum power transfer to the variable load impedance. Refinements of this approach include, but are not limited to, joint output power and signal-to-noise and distortion ratio (SNDR) maximization using a weighted cost function, and/or allowance of complex load impedances. SNDR is a measure of signal purity, and is often used in data converter specifications. SNDR is typically expressed in dB and defined by the following equation:

$$SNDR = \frac{P_{signal}}{P_{quantizationError} + P_{ramdomNoise} + P_{distortion}}, \quad (2)$$

wherein P represents an average power associated with the signal, quantization error, random noise or distortion components.

Figure 5A:
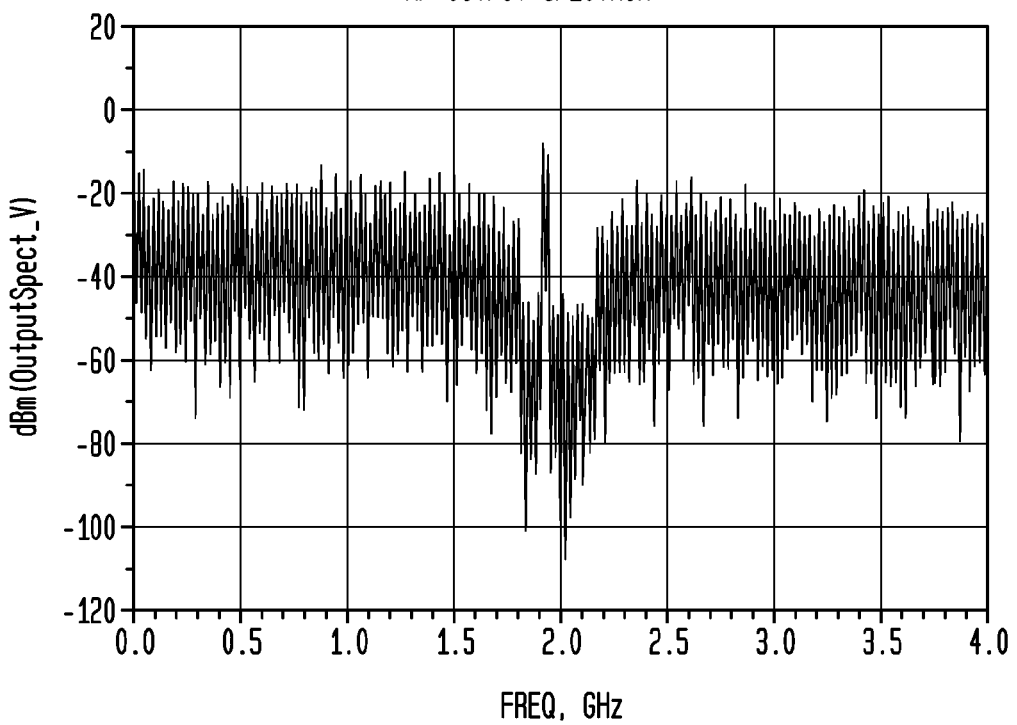
FIGS. 5A-5F show exemplary simulation performance data associated with the illustrative power amplifier shown in FIG. 4.
Figure 5B:
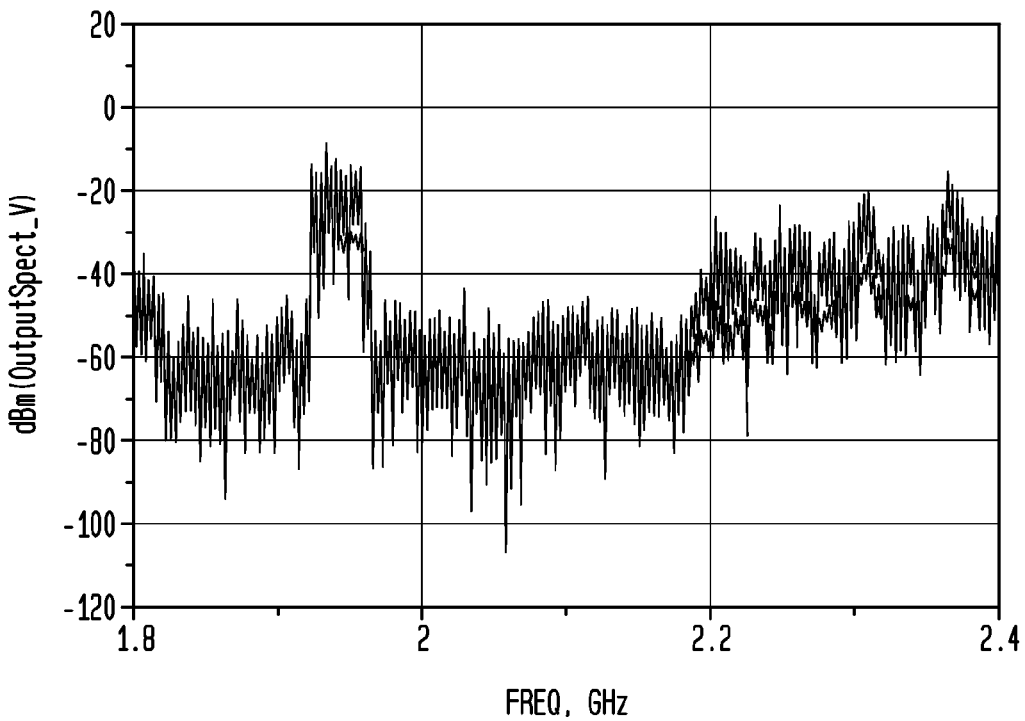
Figure 5C:
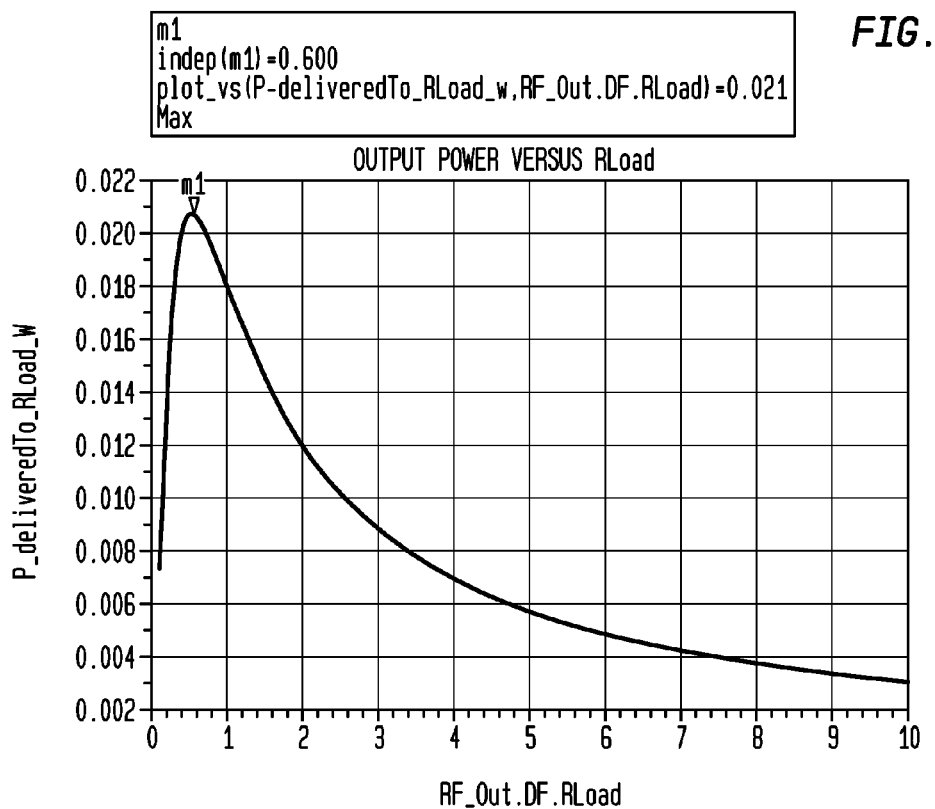
Figure 5D:
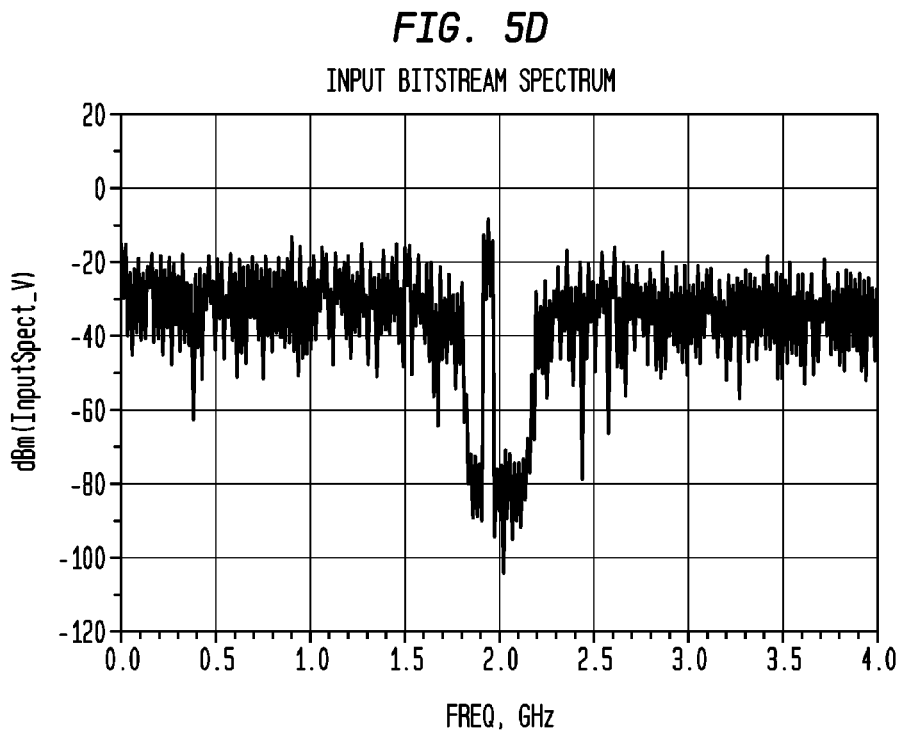
Figures 5E, 5F:
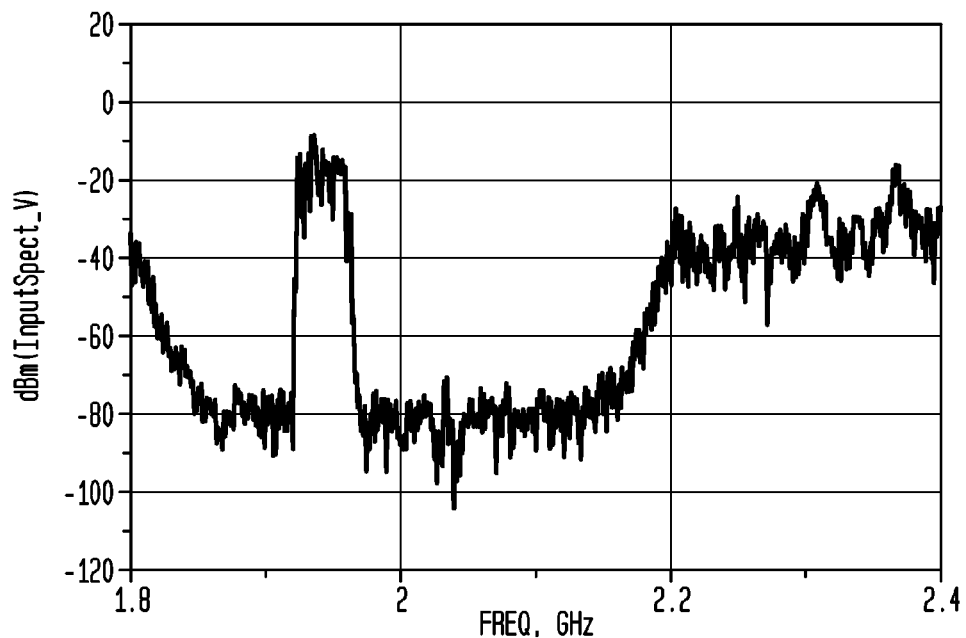

FIGS. 5A-5F show exemplary simulation performance data associated with the illustrative power amplifier shown in FIG. 4. Specifically, FIGS. 5A-5F graphically depict results of a load impedance simulation, which is performed using a varying real load impedance, $R_{LOAD}$. FIGS. 5A and 5B show standard and magnified views, respectively, of a power-versus-frequency spectrum of the composite power amplifier output signal $P_{out}$ 62. FIGS. 5D and 5E show standard and magnified views, respectively, of a power-versus-frequency spectrum of the digital bitstream 42. From the plot shown in FIG. 5C (power delivered to the real load impedance $R_{LOAD}$ versus the real load impedance $R_{LOAD}$) and the corresponding tabular information shown in FIG. 5F, it is evident that peak power transfer occurs at $R_{LOAD}$ approximately equal to 0.6Ω, in this embodiment. These results are used in the example discussed below.

Figure 6:
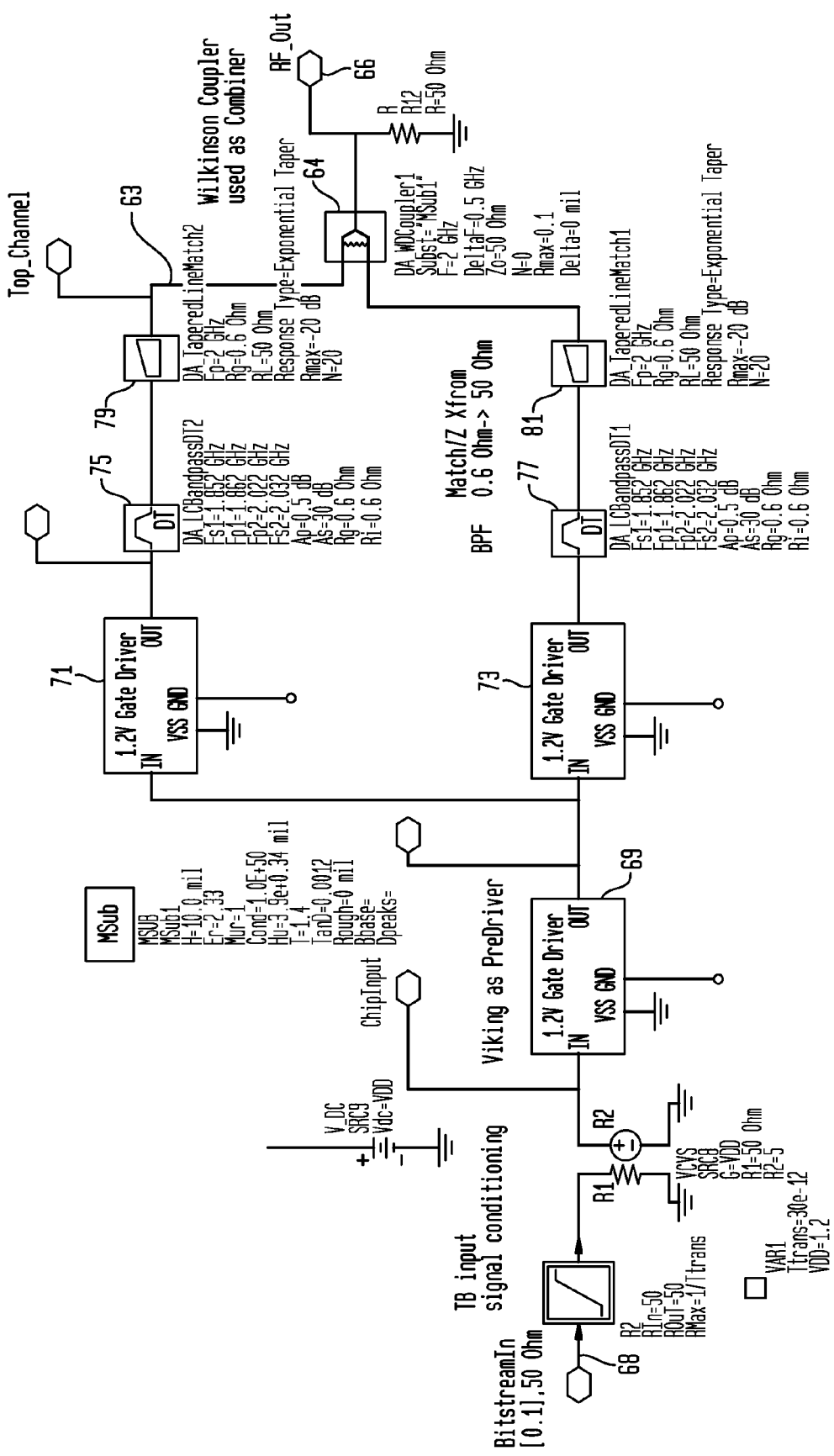
FIG. 6 shows at least a portion of an exemplary dual-channel representation of an embodiment of the invention used for simulation purposes.

FIG. 6 shows at least a portion of an exemplary dual-channel representation of an embodiment of the invention used for simulation purposes. FIGS. 7A-7F show exemplary simulated performance data associated with the illustrative embodiment shown in FIG. 6. For this simulation, an output power of approximately 17.3 dBmW (or dBm—decibel referenced to milliwatt) was achieved for a 40 MHz bandwidth 8×5 MHz wideband code-division multiple access (WCDMA) signal with a 1.942 GHz carrier and a 6.5 dB peak-to-average power ratio (PAPR). The inherent signal power in the encoded input bitstream 68, referenced to a 1V peak-to-peak level in 50Ω, is approximately −3 dBmW. Starting from the left side of FIG. 6, a voltage controlled voltage source (VCVS) translates a 1V peak-to-peak swing bitstream to a 1.2V peak-to-peak swing bitstream, which is suitable to drive a pre-driver 69 that drives two parallel channels. In each channel, a power driver 71, 73 drives a corresponding bandpass filter 75, 77 and matching circuit 79, 81 before being merged in a combiner 64. The illustrative embodiment shown in FIG. 6 essentially activates both channels in parallel; that is, the thermometer code is assumed to have enabled both AND gates 44 as shown in FIG. 3A.

Figure 7A:
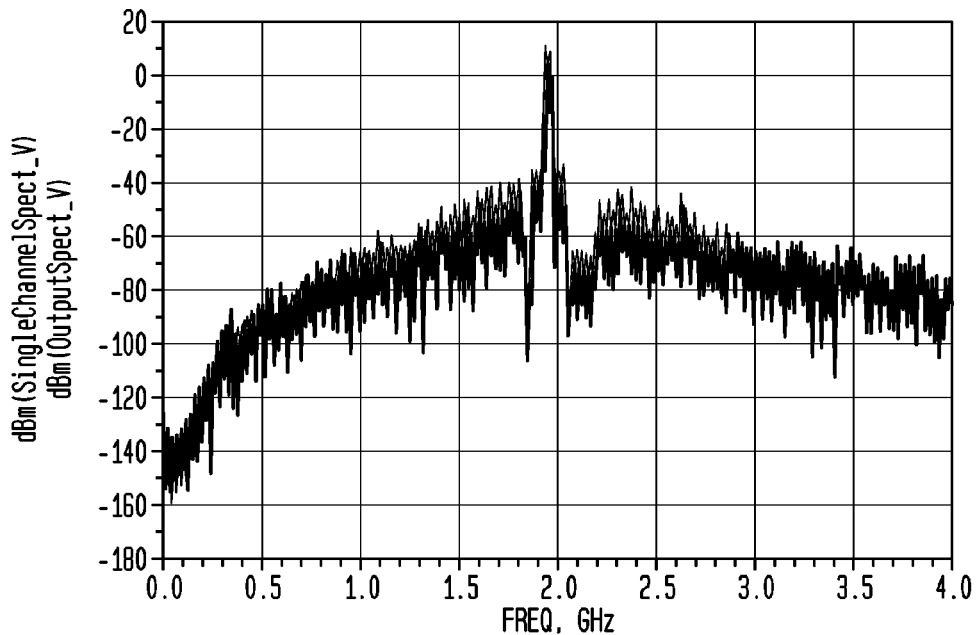
Figure 7B:
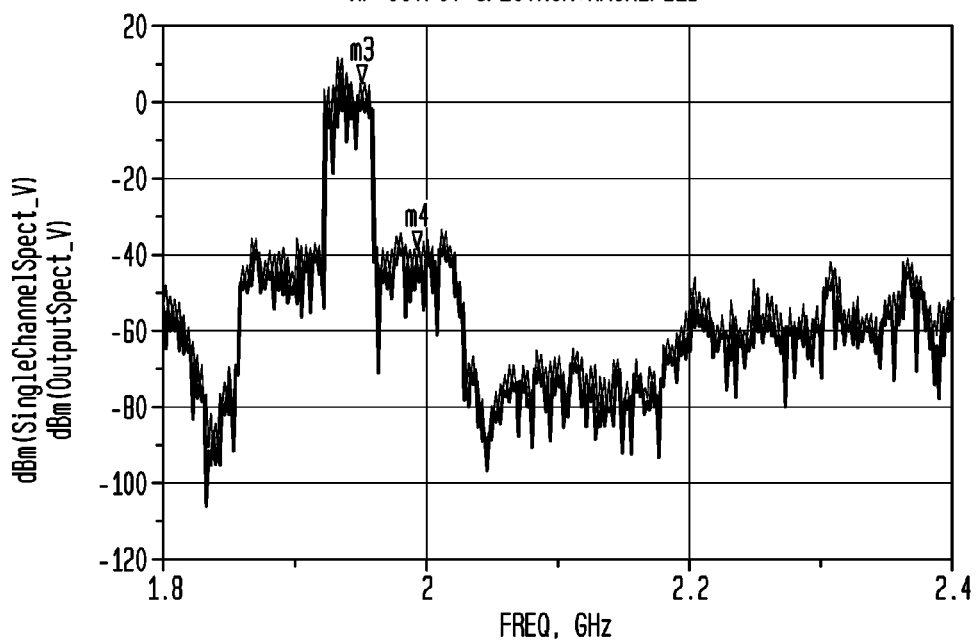
Figure 7C:
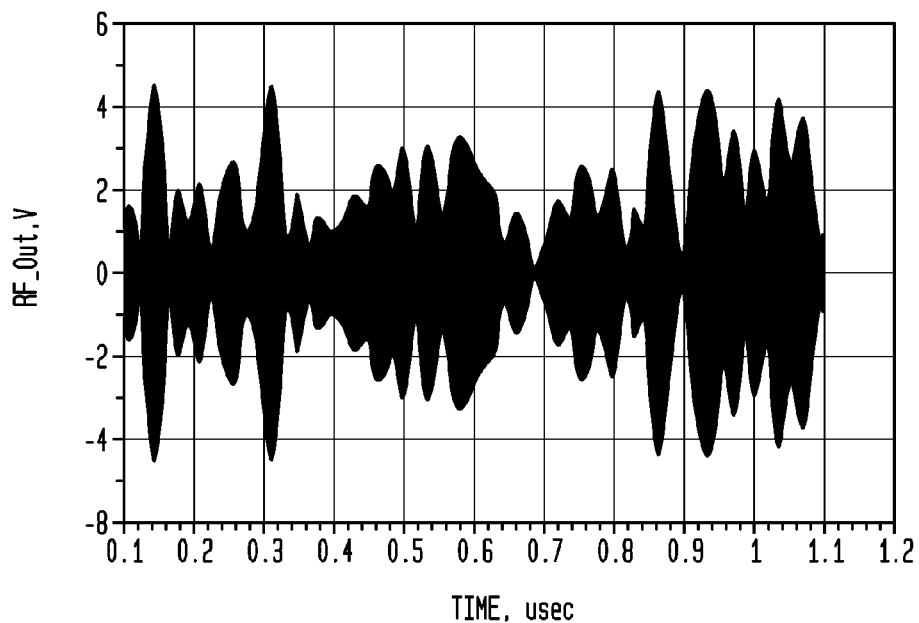
Figure 7D:
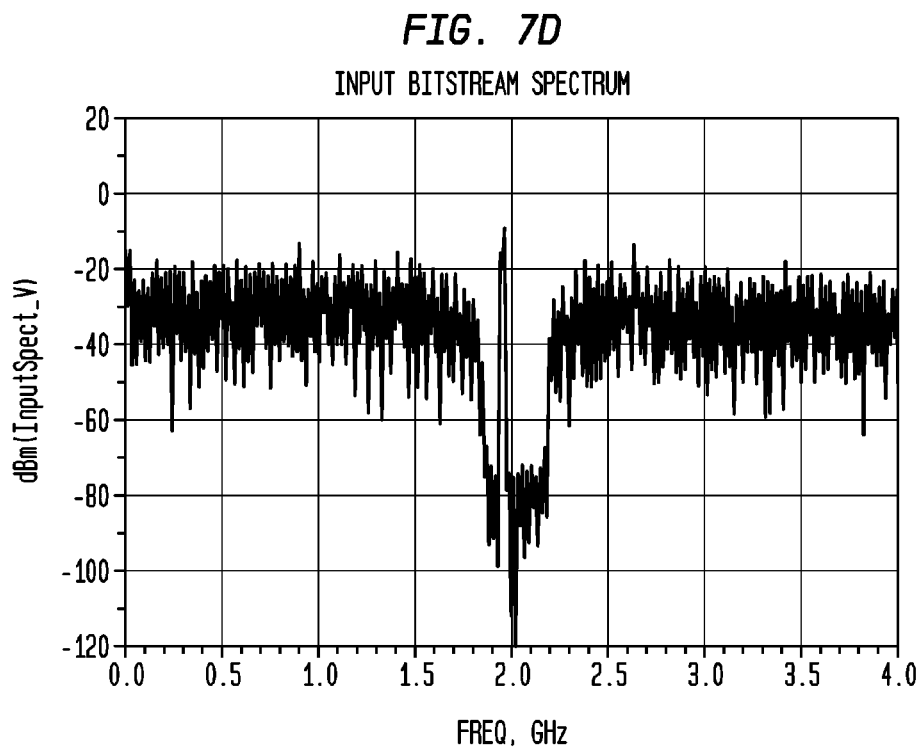

FIGS. 7A-7F show simulation results associated with the illustrative embodiment shown in FIG. 6 concerning power delivered to the combiner 64 by a single channel, which is shown as an upper channel (Top_Channel) 63 in FIG. 6. FIGS. 7A and 7B show standard and magnified views, respectively, of a power-versus-frequency spectrum of the RF output 66 shown in FIG. 6. FIGS. 7D and 7E show full-scale and magnified views, respectively, of a power-versus-frequency spectrum of the input bitstream 68. FIG. 7C shows the RF output (RF_Out) 66 spectrum in the time domain. As shown in FIG. 7F, single-channel power is approximately 14.3 dBmW (or −29 mW). As expected, for a dual-channel system, this value is approximately 3 dB below a full output power associated with the system, which is approximately 17.3 dBmW. A doubling of power, relative to that available from a single channel, is the reason for the 3 dB increase when two channels are active. These results indicate a capability of the embodiment shown in FIGS. 3A, 3B and 6 to provide programmable output power in approximately 29-mW steps, since each channel delivers approximately 29 mW and each of the channels is selectively enabled.

Accordingly, embodiments of the invention disclosed herein utilize parallel Class-S based amplifier channels to achieve higher output power than that available from a single channel. In addition, the embodiments disclosed herein support the ability to use low-level logic signals to programmably specify power output levels.

While RF power amplifiers have been described in various embodiments, these embodiments are not limited thereto. Any suitable form of power amplifier is contemplated to be within the scope of embodiments of the invention including, but not limit to, voltage- and/or current-mode configuration Class-S amplifiers.

At least a portion of the techniques of the present invention may be implemented in an integrated. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. At least a portion of the techniques of the present invention may be implemented in one or more hybrid circuits in a similar manner. Any of the exemplary circuits illustrated in the accompanying figures, or portions thereof, may be part of an integrated and/or hybrid circuit. Integrated and/or hybrid circuits so manufactured are considered part of this invention.

An integrated and/or hybrid circuit in accordance with the disclosed embodiments is capable of being utilized in essentially any application and/or electronic system in which power amplifiers are utilized. Systems incorporating such integrated and/or hybrid circuits are considered part of the disclosed embodiments. Given the teachings provided herein, one of ordinary skill in the art would be able to contemplate other implementations and applications.

The illustrations of embodiments of the invention described herein are intended to provide a general understanding of the structure of various embodiments, and they are not intended to serve as a complete description of all the elements and features of apparatus and systems that might make use of the structures described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The abstract is provided to comply with 37 C.F.R. §1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus the following claims are hereby incorporated into the Detailed Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments, and that various other changes and modifications are made therein by one skilled in the art without departing from the scope of the appended claims.

What is claimed is:

1. A composite amplifier that provides digitally selectable amplification, the composite amplifier comprising:
    a plurality of channels, each of the plurality of channels comprising:
        a digitally controllable selector;
        a Class-S power amplifier, the digitally controllable selector being operative to selectively couple a digital bitstream to the Class-S power amplifier, the Class-S power amplifier being operative to amplify the digital bitstream, thereby providing an amplified signal; and
        a bandpass filter coupled with the Class-S power amplifier, the bandpass filter being operative to filter the amplified signal, thereby providing a filtered signal; and
    a combiner operative to couple filtered signals associated with the plurality of channels and to generate a composite output signal as a function of the filtered signals.

2. The composite amplifier defined by claim 1, further comprising a driver operatively coupling the digital bitstream to the digitally controllable selector.

3. The composite amplifier defined by claim 1, further comprising a binary-to-thermometer-code decoder operatively coupled to the digitally controllable selector, the binary-to-thermometer-code decoder providing a thermometer code control signal to the digitally controllable selector in response to a binary control signal.

4. The composite amplifier defined by claim 1, wherein each of the plurality of channels further comprises an up-matching circuit operative to match an impedance associated with at least one of the plurality of channels to a prescribed impedance value.

5. The composite amplifier defined by claim 4, wherein the up-matching circuit comprises at least one of discrete sections and tapered transmission lines.

6. The composite amplifier defined by claim 1, further comprising an up-matching circuit operative to match an impedance associated with the combiner to a prescribed impedance value.

7. The composite amplifier defined by claim 1, wherein the digitally controllable selector comprises a three-state buffer and a resistor, the resistor being coupled between an output of the three-state buffer and a voltage source.

8. The composite amplifier defined by claim 1, wherein the bandpass filter comprises a series resonant circuit centered on a carrier frequency associated with the digital bitstream.

9. The composite amplifier defined by claim 1, wherein the Class-S power amplifier comprises digital telescoping inverter chains.

10. The composite amplifier defined by claim 1, wherein the Class-S power amplifier is arranged in at least one of a voltage-mode configuration and a current-mode configuration.

11. An integrated circuit, comprising:
    at least one composite amplifier adapted to provide digitally selectable amplification, the at least one composite amplifier comprising:
        a plurality of channels, each of the plurality of channels comprising:
            a digitally controllable selector;
            a Class-S power amplifier, the digitally controllable selector being operative to selectively couple a digital bitstream to the Class-S power amplifier, the Class-S power amplifier being operative to amplify the digital bitstream, thereby providing an amplified signal; and
            a bandpass filter coupled with the Class-S power amplifier, the bandpass filter being operative to filter the amplified signal, thereby providing a filtered signal; and
        a combiner operative to couple filtered signals associated with the plurality of channels and to generate a composite output signal as a function of the filtered signals.

12. A method of providing digitally selectable amplification in an amplifier, the method comprising steps of:
    selectively coupling a digital bitstream to a plurality of channels in the amplifier;

amplifying, using a Class-S power amplifier in each of the plurality of channels, the digital bitstream to provide an amplified signal associated with a corresponding one of the plurality of channels;

filtering, using a bandpass filter, amplified signals associated with the plurality of channels to provide corresponding filtered signals; and combining the filtered signals to generate a composite output signal as a function of the filtered signals.

13. The method according to claim 12, wherein the step of selectively coupling is performed using a digitally controllable selector, the method further comprising providing a thermometer code control signal to the digitally controllable selector in response to a binary control signal.

14. The method according to claim 12, further comprising matching an impedance associated with at least one of the plurality of channels to a prescribed impedance value.

15. The method according to claim 14, wherein the prescribed impedance value is substantially equal to 50 ohms.

16. An amplification system, comprising:
at least one composite amplifier for providing digitally selectable amplification, the at least one composite amplifier comprising:
a plurality of channels, each of the plurality of channels comprising:
a digitally controllable selector;
a Class-S power amplifier, the digitally controllable selector being operative to selectively couple a digital bitstream to the Class-S power amplifier, the Class-S power amplifier being operative to amplify the digital bitstream, thereby providing an amplified signal; and
a bandpass filter coupled with the Class-S power amplifier, the bandpass filter being operative to filter the amplified signal, thereby providing a filtered signal; and
a combiner operative to couple filtered signals associated with the plurality of channels and to generate a composite output signal as a function of the filtered signals.

17. The system defined by claim 16, further comprising a binary-to-thermometer-code decoder operatively coupled to the digitally controllable selector, the binary-to-thermometer-code decoder providing a thermometer code control signal to the digitally controllable selector in response to a binary control signal.

18. The system defined by claim 16, wherein each of the plurality of channels further comprises an up-matching circuit operative to match an impedance associated with at least one of the plurality of channels to a prescribed impedance value.

19. The system defined by claim 18, wherein the up-matching circuit comprises at least one of discrete sections and tapered transmission lines.

20. The system defined by claim 16, further comprising an up-matching circuit operative to match an impedance associated with the combiner to a prescribed impedance value.

21. The system defined by claim 16, wherein the digitally controllable selector comprises a three-state buffer and a resistor, the resistor being coupled between an output of the three-state buffer and a voltage source.

22. The system defined by claim 16, wherein the bandpass filter comprises a series resonant circuit centered on a carrier frequency associated with the digital bitstream.

23. The system defined by claim 16, wherein the Class-S power amplifier comprises digital telescoping inverter chains.

\* \* \* \* \*